United States Patent [19]

Schwartz et al.

[11] 3,890,169

[45] June 17, 1975

[54] METHOD OF FORMING STABLE NATIVE OXIDE ON GALLIUM ARSENIDE BASED COMPOUND SEMICONDUCTORS BY COMBINED DRYING AND ANNEALING

[75] Inventors: Bertram Schwartz, Westfield; Stuart Marshall Spitzer, Berkeley Heights; Gregory Dyett Weigle, Somerset, all of N.J.

[73] Assignee: Bell Telephone Laboratories, Incorporated, Murray Hill, N.J.

[22] Filed: Mar. 26, 1973

[21] Appl. No.: 344,702

[52] U.S. Cl. .................. 148/187; 117/200; 156/17; 148/1.5; 204/56 R

[51] Int. Cl. .............................................. H01i 7/44

[58] Field of Search.................... 148/187, 115, 188; 204/56 R; 156/17; 117/200, 201; 252/62.36 A

[56] References Cited

UNITED STATES PATENTS

| | | | |
|---|---|---|---|
| 2,686,279 | 8/1954 | Barton | 204/56 R |
| 3,531,383 | 9/1970 | Lochmann et al. | 204/56 R |
| 3,660,178 | 5/1972 | Takahashi et al | 148/187 |
| 3,687,745 | 8/1972 | Chang et al | 148/187 |
| 3,798,139 | 3/1974 | Schwartz | 204/56 R |

OTHER PUBLICATIONS

Balk, P., et al.; *Oxide Stabilization Process*, in IBM Tech. Discl. Bul., 1970, pp. 2086.

Katto, H. et al.; *Preparation & Properties of $Al_2O_3$ Films;* in *Journ. Electrochem. Soc.*, 1971, pp. 1619–1923.

*Primary Examiner*—Walter R. Satterfield
*Attorney, Agent, or Firm*—L. H. Birnbaum

[57] ABSTRACT

A method of forming a highly stable oxide on gallium arsenide containing compound semiconductors. A native oxide is grown on the surface of the semiconductor and dried during a suitable baking cycle. The oxide is then annealed at a temperature which is significantly higher than that of the baking cycle. This annealing step densifies the oxide and renders it particularly stable and impervious to impurities. In a particular embodiment, a diffusion mask is formed in accordance with the invention to permit selective area diffusion of impurities into a gallium arsenide containing compound semiconductor.

4 Claims, 6 Drawing Figures

METHOD OF FORMING STABLE NATIVE OXIDE ON GALLIUM ARSENIDE BASED COMPOUND SEMICONDUCTORS BY COMBINED DRYING AND ANNEALING

BACKGROUND OF THE INVENTION

This invention relates to the fabrication of devices employing gallium arsenide containing compound semiconductors.

In one aspect, the invention relates to a process of forming a native oxide on such a compound semiconductor which is especially stable and impervious to impurities.

In another aspect, the invention relates to a process for the selective diffusion of impurities into such a compound semiconductor and more particularly to a method of forming a diffusion mask for the control of such diffusion.

With the growing importance of gallium arsenide compound semiconductors for such applications as light emitting devices, increasing importance has been placed on developing an economical planar processing technology for these materials. One of the important fields of concern is the ability to form a layer on the surface of the semiconductor which can be used for such applications as passivation and diffusion masking. In a selective area diffusion process in particular a mask is required which will be resistant to the dopants at high temperatures while adhering to the surface of the semiconductor. A further requirement is that the masking layer permit precise line definition of the diffused regions. Deposited insulators such as $SiO_2$ or $Si_3N_4$ suffer from the problem of lifting and cracking during high temperature diffusions since there is not a sufficient bond between the insulator and semiconductor material. Other deposited insulators such as phosphosilicate glass and aluminum oxide do not permit precise line definition when used as masks since considerable lateral diffusion is observed at the dielectric-semiconductor interface.

The recent discovery of a method for growing a native oxide on gallium arsenide compound semiconductors offered considerable promise in eliminating the insulator-semiconductor interface problems inherent in the use of deposited insulators. (See U.S. patent application of B. Schwartz, Ser. No. 292,127, filed Sept. 25, 1972 and assigned to the present assignee, now U.S. Pat. No. 3,798,139.) However, it was discovered that the native oxide as grown tended to react with dopants such as Zn at the high temperatures required for diffusion, effectively destroying the oxide layer.

It is therefore an object of the invention to permit fabrication of devices from gallium arsenide containing compounds by the formation of a stable layer on the surface which will adhere strongly to the surface of the semiconductor and remain resistant to impurities even at high temperatures.

SUMMARY OF THE INVENTION

This and other objects are achieved in accordance with the invention. A native oxide is first grown on the surface of the semiconductor and dried, according to known techniques. The oxide is then annealed at a higher temperature than that of the drying cycle. this anneal is found to stabilize the oxide and make it especially resistant to outside impurities and dopants normally employed in diffusion processes. In a particular embodiment involving selective area diffusion in a GaAs semiconductor, an oxide was grown electrolytically on the surface and the oxide dried at a temperature of approximately 250°C for approximately 2 hours. The masking pattern was then delineated by standard photolithographic techniques. The oxide was then annealed at a temperature of approximately 600°C for 30 minutes so as to be made resistant to a subsequent diffusion of Zn impurities into the exposed portion of the semiconductor.

BRIEF DESCRIPTION OF THE DRAWING

These and other features of the invention will be delineated in detail in the description to follow. In the drawing.

DETAILED DESCRIPTION OF THE INVENTION

Figure 1:
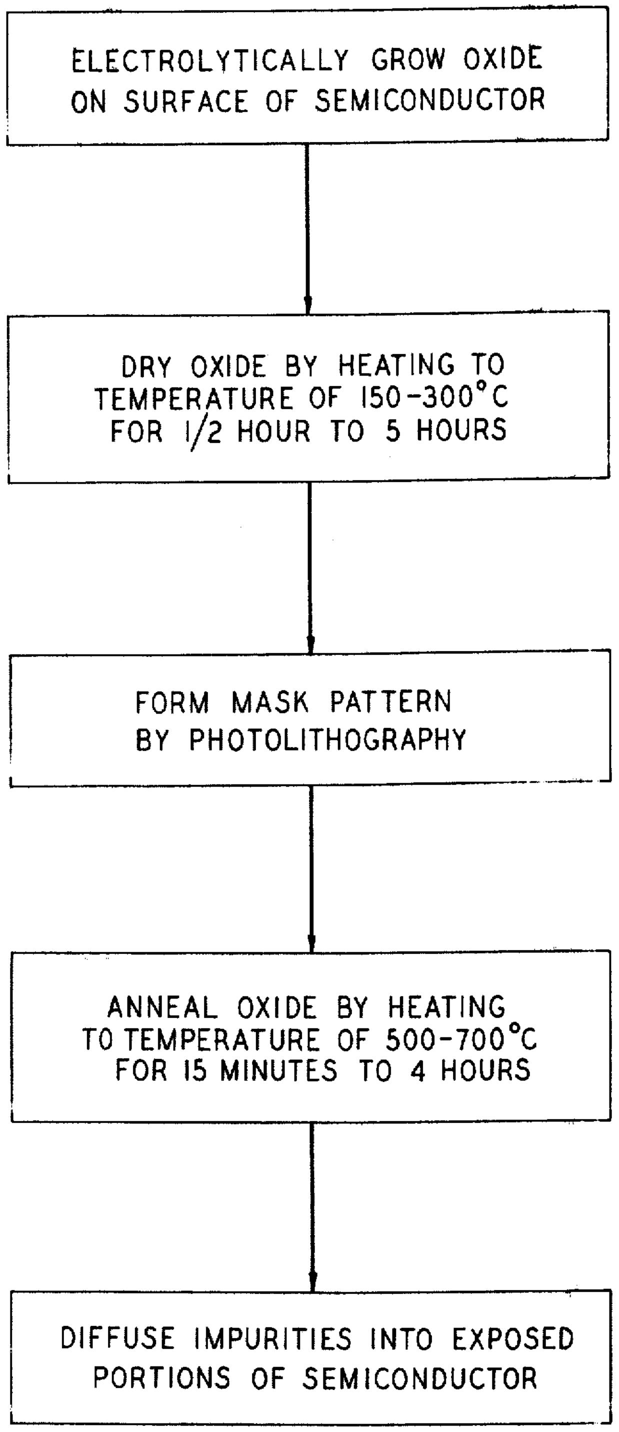
FIG. 1 is a flow diagram showing the steps of one embodiment of the invention.

A method in accordance with one embodiment of the invention is illustrated in the flow diagram of FIG. 1 and in the cross-sectional view of a semiconductor device in various stages of manufacture shown in FIGS. 2A–2E.

The sample used in this particular example was a Se-doped, n-type GaAs wafer with (111) orientation and carrier concentration of $10^{17}$-$10^{18}$ $cm^{-3}$. After standard polishing and degreasing of the wafer (10 of FIG. 2A), a native oxide, 11, was grown on the surface. The oxide was formed by making the wafer the anode in an electrolytic system employing as the electrolyte a 30% $H_2O_2$ aqueous solution with a pH adjusted to 2 by $H_3PO_4$. A constant voltage of about 100 volts was applied to the system and the oxidation was performed at room temperature. An oxide thickness of approximately 1700 A was obtained after 5 minutes. As is known in the art, a useful range for the applied potential is approximately 5–175 volts. A constant current source may be used in place of a constant voltage source. In addition, the oxidation may be performed at the boiling point of the electrolyte to further enhance oxide growth. It is also known that water alone may serve as the electrolyte. (For a detailed discussion of the electrolytic oxidation system, see U.S. Pat. application of B. Schwartz, Ser. No. 292,127, filed Sept. 25, 1972 and assigned to the present assignee, now U.S. Pat. No. 3,798,139.) It is further known that the oxide may be formed in chemical systems utilizing $H_2O_2$ or $H_2O$ alone as the oxidant (see U.S. Pat. application of R. L. Hartman, M. Kuhn and B. Schwartz, Ser. No. 239,708, filed Mar. 30, 1972). As illustrated in FIG. 1 the oxide was then dried. In this particular example, the sample was baked in a nitrogen ambient for 2 hours at 250°C. In general, a drying cycle in the range of 150°–300°C for ½ hour to 5 hours in any dry nonoxidizing ambient would be useful.

Figure 2A:
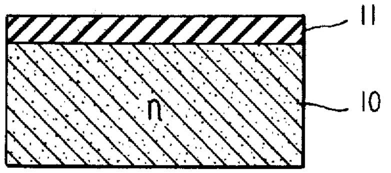
FIGS. 2A–2E are cross-sectional views of a semiconductor sample in various stages of manufacture in accordance with the same embodiment of the invention.
Figure 2B:
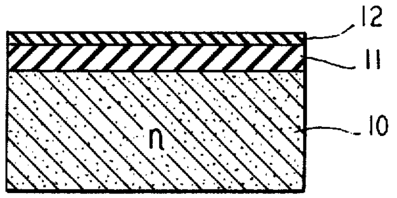
Figure 2C:
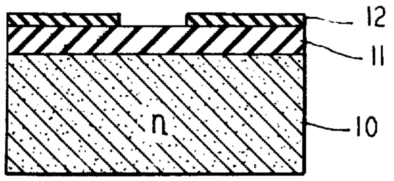

Next, the oxide mask pattern was formed by standard photolithographic techniques. Generally, as shown in FIG. 2B, this involves forming a photoresist, 12, over the oxide layer, exposing the photoresist to light through a suitable mask, and developing the photoresist so that the unexposed portion is etched away leaving a window in the photoresist as shown in FIG. 2C. With the remaining photoresist serving as a mask, the oxide may then be etched, for example, with aqueous HCl solution, to open a diffusion window in the oxide. The photoresist may then be stripped off with acetone leaving the oxide masking pattern on the surface of the substrate.

Figure 2D:
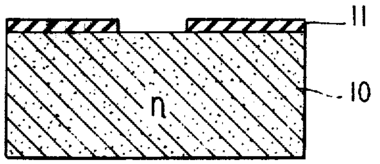

The oxide mask so formed will not stand up satisfactorily to the high temperature normally preferred for a Zn diffusion. We have found however, that high temperature stability can be achieved by annealing the oxide at a sufficiently high temperature to stabilize the oxide. In this particular example, the oxide was annealed at 600°C for 30 minutes in dry nitrogen. This step serves to densify the oxide as evidenced by a decrease in thickness of approximately 50%. This is shown in FIG. 2D. Further experiments indicate a preferable range of values for annealing at 500°–700°C for 15 minutes to 4 hours. Useful annealing may be achieved with temperatures of 450°–700°C for 15 minutes to 12 hours. Normally the longer the time and the higher the temperature the greater is the densifying. Any dry nonoxidizing ambient may be used in place of nitrogen. It should be noted that although in this example the anneal was performed subsequent to the formation of the mask pattern, the anneal may be performed prior to any mask definition if desired. The anneal preferably should be done after the drying step, however, otherwise the oxide may crack as the result of a too rapid escape of water from the oxide layer.

Figure 2E:
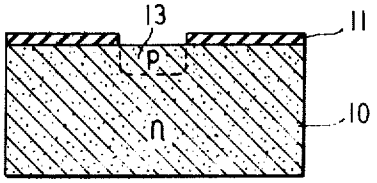

The desired dopant, in this case Zn, was then diffused into the exposed portion of the semiconductor to produce a p-type region 13 as shown in FIG. 2E. In accordance with known techniques, the sample was placed in a closed system with powdered $Zn_3As_2$ and GaAs which provided the Zn dopant and a partial pressure of As over the sample. The sample was heated at about 610°C for 25 minutes to obtain a sheet resistivity of 45 Ω/□ and to diffuse the Zn impurities to a depth of approximately 3300 A. The oxide was visibly unchanged after the diffusion step. Subsequent experiments on other samples showed that the oxide would remain unchanged even after diffusion at 650°C for times up to 2 hours.

As alluded to above, several other samples of GaAs were subjected to the steps of the present invention to produce masks of varying thickness. Some of the results are summarized in the following table:

purities occur within resolvable limits, indicating a high bond strength and low defect density at the interface between the oxide and semiconductor. Even in cases where the oxide did not completely mask against the dopant (e.g., oxide thickness of 800A), sharp boundaries were observed between the diffusion under the oxide and in the exposed portion of the semiconductor. It will be recognized that oxides of thickness less than 1300A may be used as diffusion buffers to prevent semiconductor surface damage. Thus, for example, in FIGS. 2D–2E, a thin oxide may be left in the etched window to protect the GaAs surface from damage and contamination from the ambient, while the thick portion of oxide defines the boundaries of the diffused regions. It is understood that the term "diffusion mask" as used in this application and as generally understood by those skilled in the art refers to a layer which attenuates as well as blocks essentially completely the diffusion of impurities into the semiconductor.

While the invention has been described primarily in terms of the diffusion of Zn into GaAs semiconductors, it should be clear that the process contemplates other dopants and other semiconductor materials. For example, any dopant which can be diffused at temperatures within the annealing range described above should be included. These include phosphorous, selenium and tin. It is also expected that any substituted GaAs compound semiconductor will form essentially the same native oxide which will provide an effective diffusion mask after the annealing step in accordance with the invention. This oxide has been shown to be primarily a mixture of $Ga_2O_3$ and $As_2O_3$. It is expected that the materials which may utilize the method of the invention can be generally described as $Ga_{1-x}X_xY_yAs_{1-y}$ where X may be Al or In, Y may be P or Sb, and, $x$ and $y$ may vary from zero to 0.95 (i.e., at least 5% of gallium arsenide should be present in the compound to form the oxide). Of special interest in this class are GaAlAs and GaPAs.

It should also be recognized that although the description of the invention has focused upon a selective area diffusion process, the formation of this stable oxide has many other uses. For example, the oxide may be used as a passivation layer to protect the semicon-

| Sample | Applied Potential | Temperature of Electrolyte | Thickness of Oxide As Grown | Annealing Cycle | Thickness of Oxide After Anneal | Diffusion Cycle | Zn Depth in Exposed GaAs | Zn Depth Under Oxide |
|---|---|---|---|---|---|---|---|---|
| 1 | 100V | Room Temp. | 1700A | 650°C-15 Min | 800A | 610°C-120 Min | 0.85μm | 0.55μm |
| 2 | 150V | Room Temp. | 2880A | 600°C-30 Min | 1600A | 610°C-25 Min | 0.35μm | 0 |
| 3 | 100V | Boiling | 2375A | 600°C-30 Min | 1300A | 610°C-25 Min | 0.33μm | 0 |
| 4 | 160V | Boiling | 4875A | 600°C-30 Min | 3600A | 620°C-25 Min | 0.44μm | 0 |

All samples were oxidized in an $H_2O_2$ aqueous electrolyte for 5 minutes, the oxide dried at 250°C for 2 hours in a nitrogen ambient and then a 0.34 mm wide stripe defined in the oxide. Annealing was also done in a nitrogen ambient.

It was discovered that a minimum oxide thickness of approximately 1300A after the annealing cycle was required to completely mask against a 3300A Zn diffusion. It was observed that no lateral diffusion of Zn imductor material in the final device from outside contaminants. In another example, the oxide layer may be used as a mask in a selective etching process where it is desired to use an etchant such as aqua regia which would tend to dissolve the oxide as grown.

Various additional modifications and extensions of the invention will become apparent to those skilled in the art. All such variations which basically rely on the teachings through which the invention has advanced the art are properly considered within the spirit and scope of the invention.

What is claimed is:

1. In a process for fabricating a compound semiconductor device, the method of forming a stable oxide on the surface of a semiconductor portion comprising a material selected from the group consisting of GaAs, GaAlAs and GaPAs, comprising the steps of growing an oxide on the surface of the said semiconductor portion, drying said oxide by heating to a temperature of approximately 150–300°C for approximately ½ hour to 5 hours in a nonoxidizing ambient and subsequently annealing the oxide by heating to a temperature of approximately 450°–700°C for a period of approximately 15 minutes to 12 hours in a nonoxidizing ambient.

2. The method according to claim 1 wherein the oxide is annealed by heating to a temperature of approximately 500°–700°C for a period of approximately 15 minutes to 4 hours.

3. The method according to claim 1 wherein the nonoxidizing ambient is nitrogen.

4. The method according to claim 1 wherein the compound semiconductor is GaAs.

* * * * *